US006605994B2

(12) United States Patent
Kim et al.

(10) Patent No.: US 6,605,994 B2
(45) Date of Patent: Aug. 12, 2003

(54) STABILIZED HIGH BAND WIDTH DIFFERENTIAL EMITTER FOLLOWER AMPLIFIER

(75) Inventors: Jong K. Kim, Longmont, CO (US); Elangovan Nainar, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/854,061

(22) Filed: May 11, 2001

(65) Prior Publication Data

US 2002/0175753 A1 Nov. 28, 2002

(51) Int. Cl.[7] .................................................. H03F 3/45
(52) U.S. Cl. ..................... 330/252; 330/259; 330/290
(58) Field of Search ................... 330/252, 259, 330/290, 292, 311, 260; 360/67, 68

(56) References Cited

U.S. PATENT DOCUMENTS

| | | | | |
|---|---|---|---|---|
| 3,860,836 A | | 1/1975 | Pedersen | 307/303 |
| 4,974,916 A | * | 12/1990 | Donig | 330/252 |
| 5,351,012 A | * | 9/1994 | Toumazou | 330/265 |
| 5,515,007 A | * | 5/1996 | Moraveji | 330/263 |

* cited by examiner

*Primary Examiner*—Robert Pascal
*Assistant Examiner*—Khanh Van Nguyen
(74) *Attorney, Agent, or Firm*—Kinney & Lange, P.A.

(57) ABSTRACT

A differential amplifier with an emitter follower input stage includes an RC network which provides negative common mode feedback to stabilize the emitter follower stage. The feedback network provides negative common mode feedback from collector to base of the emitter follower transistors.

24 Claims, 4 Drawing Sheets

STABILIZED HIGH BAND WIDTH DIFFERENTIAL EMITTER FOLLOWER AMPLIFIER

CROSS-REFERENCE TO RELATED APPLICATION(S)

None.

BACKGROUND OF THE INVENTION

This invention relates to emitter follower circuits. In particular, the present invention relates to stabilization of an emitter follower input stage of an integrated circuit differential amplifier to provide stabilized high band width performance.

An emitter follower circuit is well known to be potentially unstable when its output is capacitively loaded. This potential instability is the result of the input impedance of the emitter follower having a real part which becomes negative as a function of frequency. This can cause oscillation or instability when certain forms of source impedance are connected to the input terminal of the emitter follower.

An example of a circuit in which performance can be limited by potential instability of an emitter follower is a preamplifier connected to a magneto-resistive (MR) sensor read head of a disc drive. Source inductance, such as the inductance associated with the leads between the MR sensor and the preamplifier, can result in oscillation or instability of the emitter follower input stage of the preamplifier.

One approach for stabilization of an emitter follower is described in the Peterson U.S. Pat. No. 3,860,836. The load impedance of the emitter follower includes inherent load capacitance which provides a negative real term at some frequencies in the input impedance viewed from the base of the emitter follower transistor. An RC network is connected to the base of the emitter follower so that the network is effectively in parallel across the base and emitter. The disadvantages of this stabilization technique described in the Peterson patent include higher noise and a limited frequency range over which the stabilization is effective.

There is a need for improved stabilization of emitter follower stages of differential amplifiers used in high band width applications. An example is a preamplifier for an MR sensor in a disc drive, where stabilization is required at frequencies ranging from about 500 megahertz to about 10 gigahertz.

BRIEF SUMMARY OF THE INVENTION

The present invention is a differential amplifier having a pair of emitter follower input transistors forming an emitter follower input stage. A stabilization network is connected to the collectors of the emitter follower input transistors to provide negative common mode feedback at frequencies where the real part of the input impedance of the emitter followers becomes negative.

DETAILED DESCRIPTION

Figure 1:
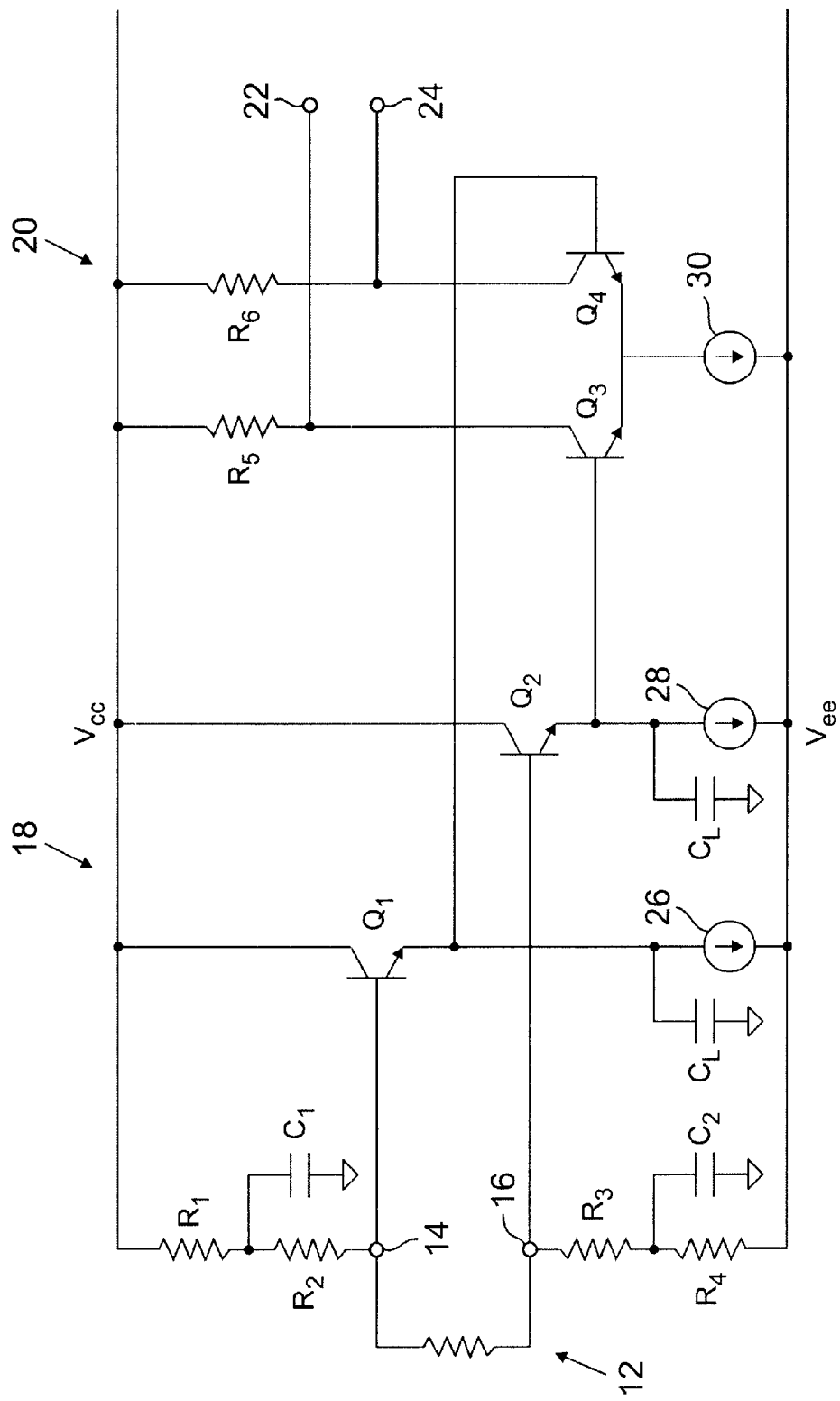
FIG. 1 is a simplified electrical schematic diagram of a prior art preamplifier for amplifying signals from a magnetoresistive sensor.

FIG. 1 is an electrical schematic diagram of a prior art preamplifier 10 used to amplify signals produced by magnetoresistive (MR) sensor 12, which is connected to input terminals 14 and 16. Preamplifier 10 includes emitter follower input stage 18 and differential amplifier stage 20. The output of preamplifier 10 is provided at output terminals or nodes 22 and 24.

Input stare 18 includes emitter follower transistors $Q_1$, and $Q_2$ resistors $R_1$–$R_4$, capacitors $C_1$ and $C_2$, current sources 26 and 28, and inherent load capacitances $C_L$.

Differential amplifier stage 20 includes transistors $Q_3$ and $Q_4$, resistors $R_5$ and $R_6$, and current source 30. The output of differential amplifier stage 20 appears at output terminals 22 and 24.

FIG. 1 illustrates the use of an RC (resistance-capacitance) circuit connected to the base of each emitter follower transistor, as taught in the Peterson U.S. Pat. No. 3,860,836. Capacitor $C_1$ and resistor $R_2$ are connected between the base of transistor $Q_1$ and ground. Similarly, resistor $R_3$ and capacitor $C_2$ are connected from the base of transistor $Q_2$ to ground. Although the addition of the RC circuits to the bases of transistors $Q_1$ and $Q_2$ provide some stabilization, the use of those RC circuits introduces higher noise. In addition, the stabilization shown in FIG. 1 is not effective over a wide frequency range. In the case of preamplifier for an MR sensor in a high performance disc drive, stabilization over that frequency range is needed for frequencies ranging from 500 MHz to about 10 GHz.

Figure 2:
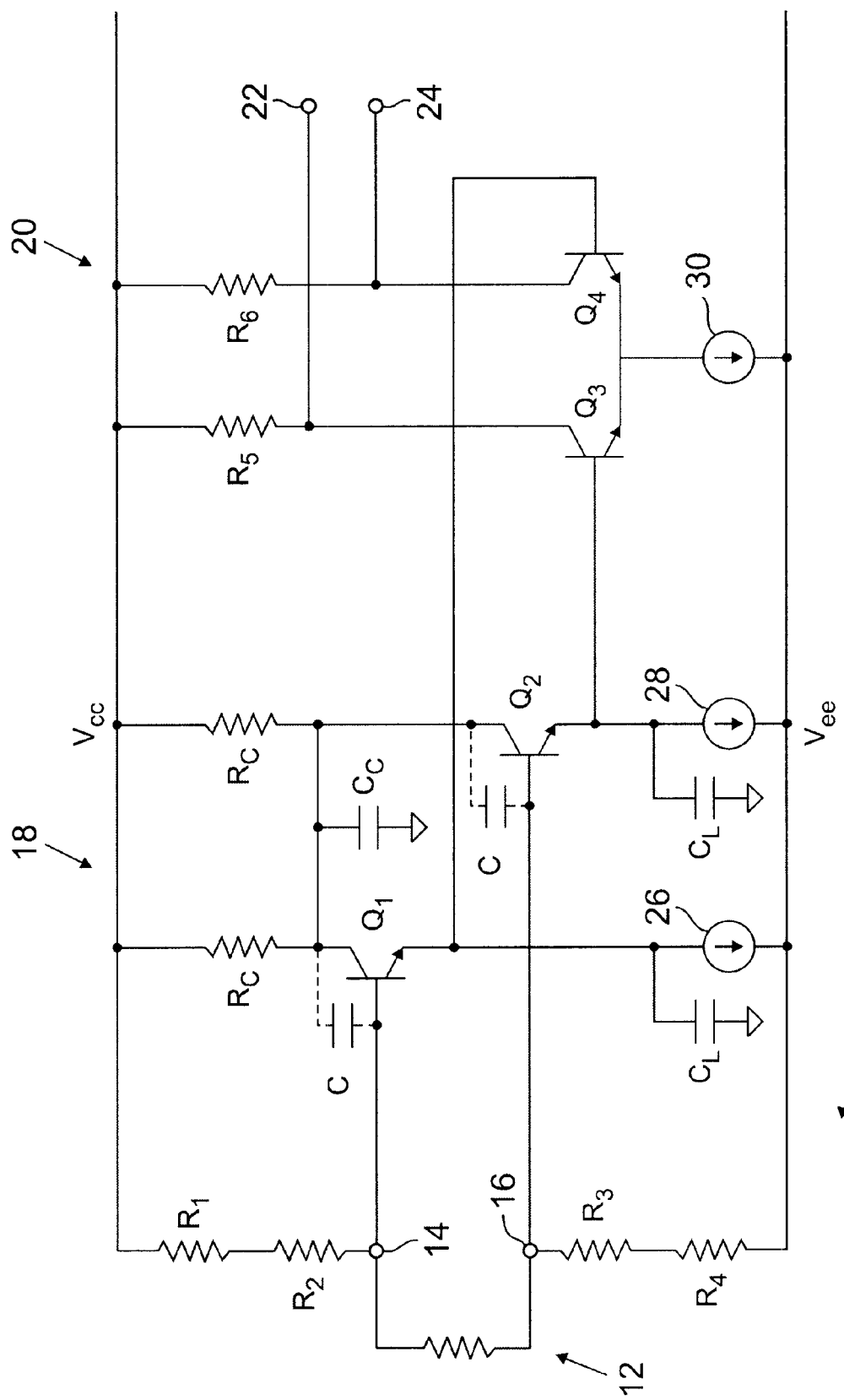
FIG. 2 is a schematic diagram of a first embodiment of the present invention including a common mode feedback stabilization network a the emitter follower input stage.

FIG. 2 shows a first embodiment of the present invention. Preamplifier 40 contains many of the same components found in prior art preamplifier 10, and similar components are labeled with similar reference numerals and characters. Preamplifier 40, however, eliminates the use of stabilization capacitors $C_1$ and $C_2$ found in the prior art preamplifier 10. Instead, input emitter follower stage 18' of amplifier 40 includes an RC network formed by resistors Rc, capacitor Cc and parasitic capacitances $C\mu$ of transistors $Q_1$ and $Q_2$. The RC network provides common mode amplification and negative feedback at frequencies where the real part of the input impedance of the emitter followers becomes negative.

Resistors Rc are connected between the collectors of transistors $_1$ and $Q_2$ and supply terminal VCC. Capacitor Cc is connected between the collectors of $Q_1$ and Qand ground. Alternatively, capacitor $C_C$ can be connected between the collectors of $Q_1$ and $Q_2$ and VCC.

The parasitic capacitances $C\mu$ between base and collector of each of the transistors $Q_1$ and $Q_2$ provides feedback of the common mode gain produced by resistors Rc. As a result of the Miller effect, capacitances $C\mu$ of transistors of $Q_1$ and $Q_2$ are increased by the voltage gain at the collectors of transistors $Q_1$ or $Q_2$. The dashed lines associated with capacitances $C\mu$ indicates that they are inherent parasitic capacitances.

By tying together the collectors of transistors $Q_1$ and $Q_2$, no additional differential signal is introduced into amplifier 46, for example, by differences in resistance connected to the collectors of $Q_1$ and $Q_2$.

Figure 3:
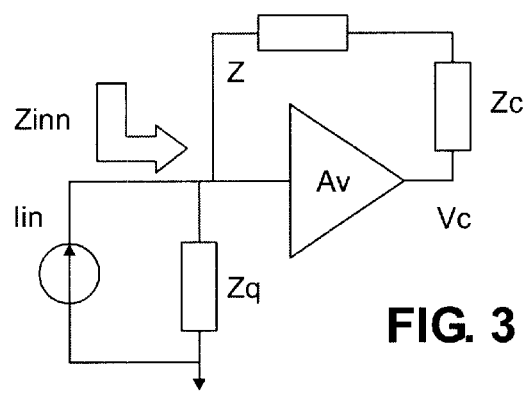
FIG. 3 is a diagram showing mathematical modeling of transfer functions of the stabilized emitter follower stage of the present invention.

FIG. 3 is a diagram of a mathematical model of an emitter follower which uses the feedback of the present invention. With the preamplifier 40 of the present invention, two circuits like the one shown in FIG. 3 exists, one for each of the two emitter followers in emitter follower stage 18'.

The purpose of FIG. 3 is to illustrate the components which will be used in analyzing the performance of the emitter follower using the common mode feedback of the present invention. $Z_{inn}$ represents the input impedance viewed from the base of the emitter follower transistor $Q_1$ or $Q_2$ with the circuitry of the present invention. $A_v$ represents the open loop gain of transistor gain Q or $Q_2$. $Z_c$ is the impedance of the RC network of the present invention formed by capacitor Cc and resistors Rc. $Z_\mu$ is the impedance of the parasitic capacitance $C\mu$. $Z_q$ is the impedance connected to the base of $Q_1$ or $Q_2$. In the case of $Q_1$, $Z_q$ is the impedance produced by resistance $Rb=R_1+R_2$, load capacitance CL, a load resistance RL associated with current source 22, base-emitter resistance $R\pi$, and base-emitter capacitance $C\pi$.

The following equations are derived from the model shown in FIG. 3.

$$Z_p(f) := \frac{R_\pi}{1 + s(f) \cdot R_\pi \cdot C_\pi} \quad \text{EQ. 1}$$

$$Z_L(f) := \frac{R_L}{1 + s(f) \cdot R_L \cdot C_L} \quad \text{EQ. 2}$$

$$Z_c(f) := \frac{R_c}{1 + s(f) \cdot R_c \cdot C_c} \quad \text{EQ. 3}$$

$$Z_\mu(f) := \frac{1}{s(f) \cdot C_\mu} \quad \text{EQ. 4}$$

$$A_v(f) := \frac{-1 \cdot g_m \cdot Z_c(f) \cdot Z_p(f)}{(1 + g_m \cdot Z_p(f)) \cdot Z_L(f) + Z_p(f)} \quad \text{EQ. 5}$$

$$Z_b(f) := Z_p(f) + (1 + g_m \cdot Z_p(f)) \cdot Z_L(f) \quad \text{EQ. 6}$$

$$Z_q(f) := \frac{1}{\frac{1}{Z_b(f)} + \frac{1}{R_b}} \quad \text{EQ. 7}$$

$$Z_{inn}(f) := \frac{Z_q(f) \cdot (Z_\mu(f) + z_c(f))}{Z_\mu(f) + Z_c(f) + (1 - A_v(f)) \cdot Z_q(f)} \quad \text{EQ. 8}$$

$Z_{INN}(f)$ shown is Eq. 8 represents the input impedance of the improved emitter follower of the present invention. By comparison, the input impedance $Z_{INO}(f)$ for the prior art emitter follower is:

$$Z_{ino}(f) := \frac{Z_q(f) \cdot (Z_\mu(f) + 0)}{Z_\mu(f) + 0 + (1 - 0) \cdot Z_q(f)}$$

The Zc (f) component of EQ 8 is zero in EQ 9. This is because the collectors of $Q_1$ in the prior art circuit are connected to VCC. There is no $R_C$ in the prior art circuit and no common mode gain, and Zc (f) and Av (f) are zero.

Figure 4:
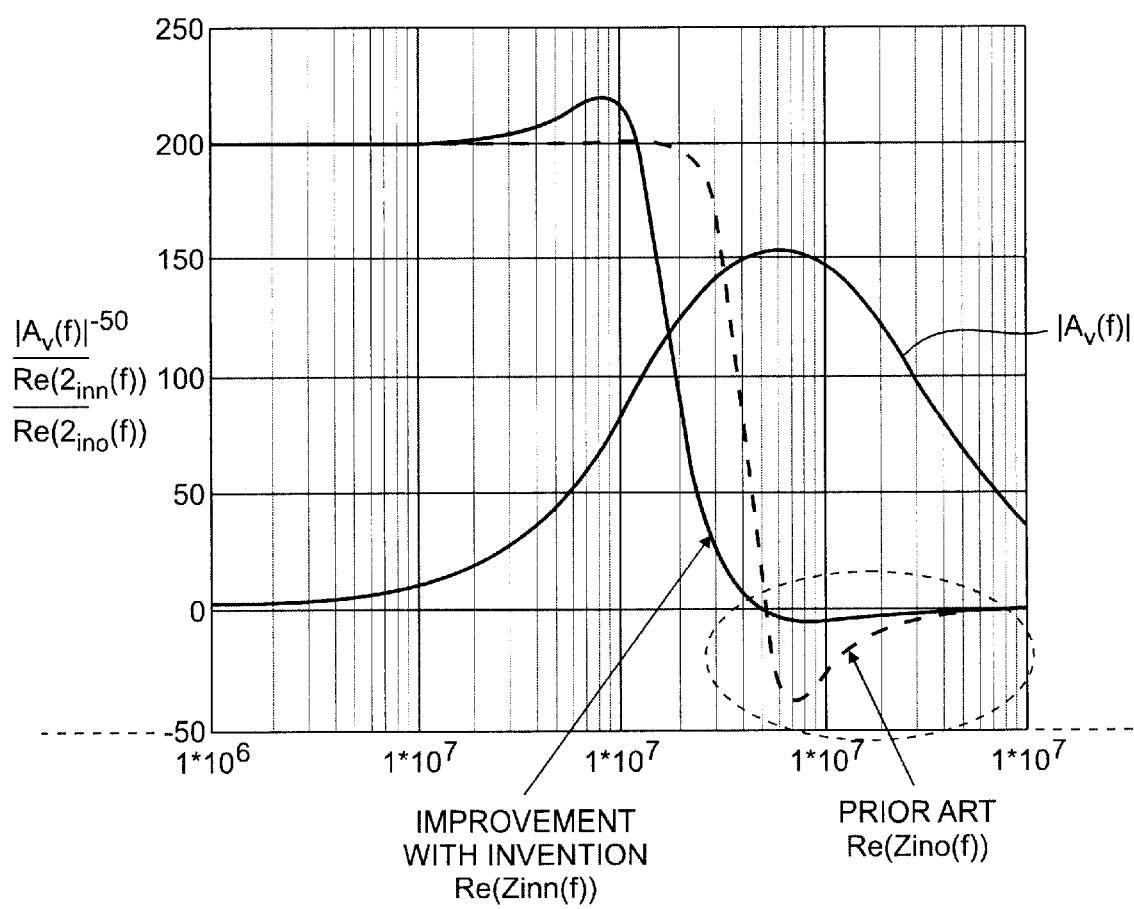
FIG. 4 is a graph of the real component of input impedance and gain as a function of frequency for the circuit of the present invention shown in FIGS. 2 and 3, and the real component of input impedance for the prior art circuit of FIG. 1.

FIG. 4 shows a plot of $A_V(f)$ and the real component of $Z_{inn}(f)$ of the present invention as a function of frequency ranging from $10^6$ Hertz to $10^{10}$ Hertz. For comparison, the real component of $Z_{ino}(f)$ is also shown in FIG. 4. So that all three curves are on the same vertical scale, $A_v(f)$ has been multiplied times 50.

The curves shown in FIG. 4 were calculated using the following values for resistances, capacitances, and frequencies:

As shown in FIG. 4, the prior art circuit exhibits a region of instability between about $5 \times 10^8$ Hertz and $10^{10}$ Hertz. In this region of instability, the real component of input impedance $Z_{ino}(f)$ is negative. This can result in oscillation and instability of prior art amplifier 10.

In contrast, the real component of the input impedance $Z_{inn}(f)$ is only slightly negative in the same region of instability. The amount by which the real component is negative is so small that the present invention provides stable performance over the entire frequency range of interest. There are three reasons for this stability, despite the calculations which show a very slight negative real component. First, as long as the real component of the input impedance is either positive or less negative than -1, the Nyquist criteria indicates that the circuit will be stable. Second, in actual practice the inherent load includes a small inherent resistance in series with the inherent load capacitance $C_L$. Third, there is resistance associated with interconnections which also contributes to a positive real component. As a result, with the present invention, the RC network of the present invention results in a real component of input impedance which is positive at all times.

Figure 5:
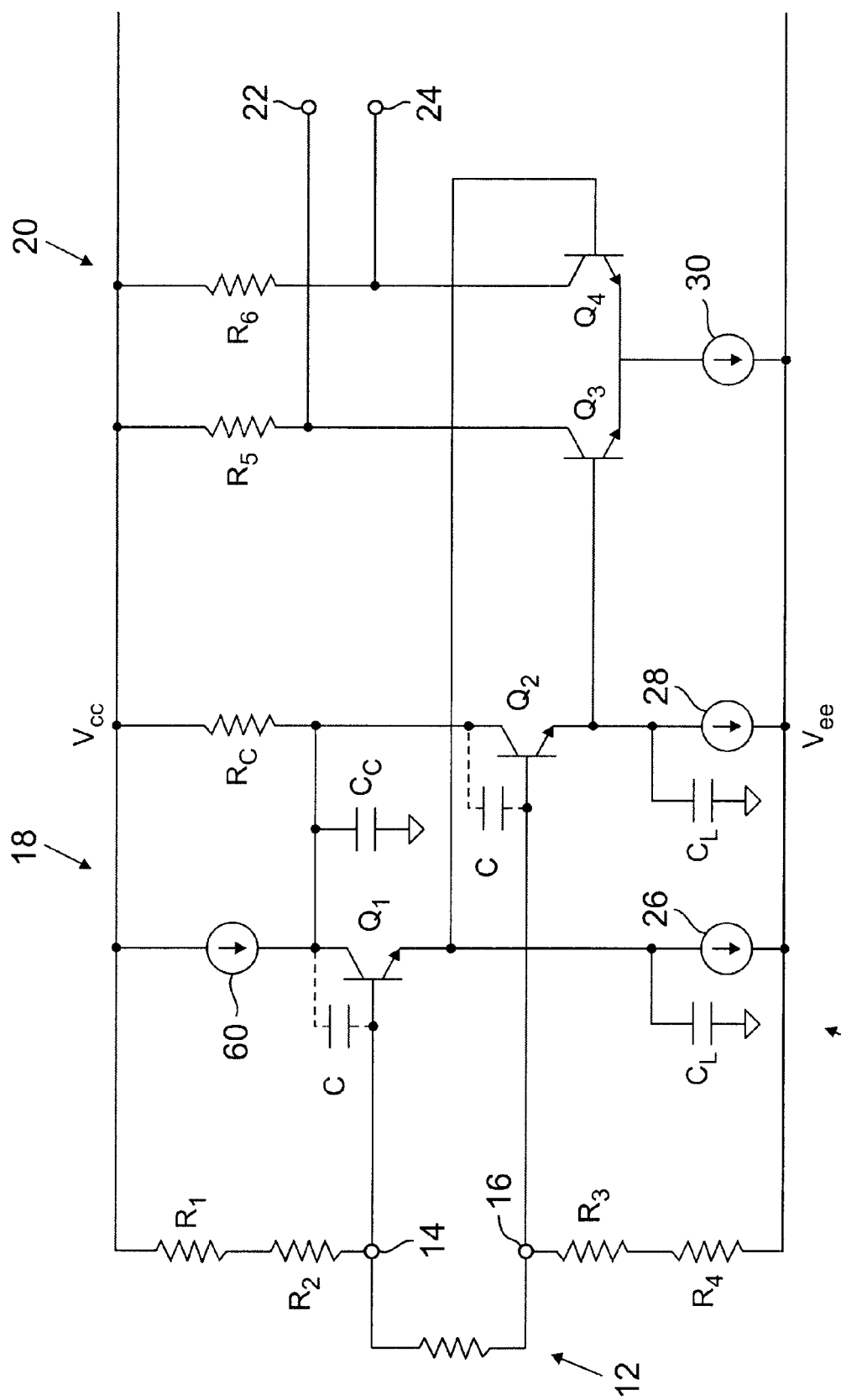
FIG. 5 is an electrical schematic diagram of a second embodiment of the present invention.

FIG. 5 shows preamplifier circuit 50, which is another embodiment of the present invention. Preamplifier 50 is generally similar to preamplifier 40 of FIG. 2 with one exception. In input emitter follower stage 18", current source 60 replaces one of the resistors Rc. The advantage of using current source 60 is that a majority of the bias current for the emitter followers can be provided by current source 60, rather than through resistor $R_C$.

With the embodiment of the present invention shown in FIG. 2, there is limited voltage headroom in the amplifier circuitry, which effectively limits the size of resistors Rc which can be used since the bias current flows through resistors Rc. This in turn limits the common mode gain which can be achieved, and thus the amount of negative feedback to the bases of $Q_1$ and $Q_2$ through parasitic capacitances $C\mu$. By the use of current source 60 in place of one of the resistors Rc in FIG. 5, most of the bias current flows through current source 60 rather than through Rc. The impedance of current source 60 is ideally infinite. As a result, in FIG. 5 Rc can be made larger without sacrificing the needed bias current or exceeding the headroom available between the collectors $Q_1$ and $Q_2$ and VCC. As a result, the common mode gain can be larger. This results in an enhanced amount of common mode negative feedback to eliminate the negative real component of input impedance.

The present invention provides stability over a wide frequency range by providing negative common mode feedback at the frequencies where the negative real part of input impedance of the emitter follower stage occurs. Suppressed oscillation is particularly important in preamplifiers used in high performance disc drives where a low data error rate is required.

Although the present invention has been described with reference to preferred embodiments, workers skilled in the art will recognize that changes may be made in form and detail without departing from the spirit and scope of the invention.

What is claimed is:

1. An amplifier comprising:
    a first emitter follower transistor having a base, a collector and an emitter, and exhibiting a first parasitic capacitance between its collector and its base;
    a second emitter follower transistor having a base, a collector and an emitter, and exhibiting a second parasitic capacitance between its collector and its base;

a differential pair of transistors connected to the emitters of the first and second emitter follower transistors; and a negative feedback circuit connected to the collectors of the first and second emitter follower transistors for providing negative common mode feedback to the first and second emitter follower transistors through the first and second parasitic capacitances, respectively.

2. The amplifier of claim 1 wherein the negative feedback circuit comprises:

a resistance connected to the collectors of the first and second emitter follower transistors; and a capacitance connected to the collectors of the first and second emitter follower transistors.

3. The amplifier of claim 2 wherein the resistance is connected between the collectors and a first supply voltage node.

4. The amplifier of claim 3 wherein the capacitance is connected between the collectors and ground.

5. The amplifier of claim 2 wherein the negative feedback circuit further comprises:

a current source connected to the collectors of the first and second emitter follower transistors.

6. The amplifier of claim 1 wherein the collectors of the first and second emitter transistors are connected together.

7. The amplifier of claim 1 wherein the amplifier is fabricated in an integrated circuit.

8. An amplifier comprising:

a pair of emitter follower transistors;

a resistance-capacitance (RC) network connected to the pair of emitter follower transistors to provide negative feedback from collector to base of the emitter follower transistors with common mode gain through parasitic capacitances of the emitter follower transistors.

9. The amplifier of claim 8 wherein the RC network is connected to a collector of each of the emitter follower transistors.

10. The amplifier of claim 9 and further comprising:

a current source connected to the collectors of the emitter follower transistors.

11. The amplifier of claim 8 and further comprising:

a differential amplifier transistor pair connected to the pair of emitter follower transistors.

12. The amplifier of claim 8 wherein the amplifier is fabricated in an integrated circuit.

13. An amplifier comprising:

a first emitter follower transistor having a base, a collector and an emitter;

a second emitter follower transistor having a base, a collector and an emitter;

a differential pair of transistors connected to the emitters of the first and second emitter follower transistors; and a negative feedback circuit connected to the collectors of the first and second emitter follower transistors for providing negative common mode feedback to the first and second emitter follower transistors, the feedback circuit comprising:

a resistance connected between the collectors of the first and second emitter follower transistors and a first voltage node; and a capacitance connected to the collectors of the first and second emitter follower transistors.

14. The amplifier of claim 13 wherein the capacitance is connected between the collectors and ground.

15. An amplifier comprising:

a first emitter follower transistor having a base, a collector and an emitter;

a second emitter follower transistor having a base, a collector and an emitter;

a differential pair of transistors connected to the emitters of the first and second emitter follower transistors; and a negative feedback circuit connected to the collectors of the first and second emitter follower transistors for providing negative common mode feedback to the first and second emitter follower transistors, the feedback circuit comprising:

a resistance connected to the collectors of the first and second emitter follower transistors;

a capacitance connected to the collectors of the first and second emitter follower transistors; and a current source connected to the collectors of the first and second emitter follower transistors.

16. The amplifier of claim 15 wherein the capacitance is connected between the collectors and the first voltage node.

17. An amplifier comprising:

a pair of emitter follower transistors;

a resistance-capacitance (RC) network connected to a collector of each of the emitter follower transistors to provide negative feedback from collector to base of the emitter follower transistors with common mode gain; and a current source connected to the collectors of the emitter follower transistors.

18. An amplifier comprising:

a pair of emitter follower transistors each having a base, a collector and an emitter; and a resistance-capacitance (RC) network for providing negative feedback from collector to base of the emitter follower transistors with common mode gain, the RC network comprising:

a resistance connected between the collectors of the emitter follower transistors and a first voltage node; and a capacitance connected to the collectors of the emitter follower transistors.

19. The amplifier of claim 18 wherein the capacitance is connected between the collectors and ground.

20. The amplifier of claim 18 where in the capacitance is connected between the collectors and the first voltage node.

21. The amplifier of claim 18 wherein the RC network further comprises:

a current source connected to the collectors of the emitter follower transistors.

22. The amplifier of claim 18, wherein the collectors of the emitter follower transistors are connected together.

23. The amplifier of claim 18 and further comprising:

a differential amplifier transistor pair connected to the pair of emitter follower transistors.

24. The amplifier of claim 18 wherein the amplifier is fabricated in an integrated circuit.

* * * * *

UNITED STATES PATENT AND TRADEMARK OFFICE
CERTIFICATE OF CORRECTION

PATENT NO. : 6,605,994 B2
DATED : August 12, 2003
INVENTOR(S) : Jong K. Kim

It is certified that error appears in the above-identified patent and that said Letters Patent is hereby corrected as shown below:

<u>Column 3,</u>
Line 52, insert -- EQ. 9 --

Signed and Sealed this

Twenty-seventh Day of January, 2004

JON W. DUDAS
*Acting Director of the United States Patent and Trademark Office*